(12) United States Patent
Ahn et al.

(10) Patent No.: US 9,865,787 B2
(45) Date of Patent: Jan. 9, 2018

(54) CHIP SUBSTRATE AND CHIP PACKAGE MODULE

(71) Applicant: Point Engineering Co., Ltd., Asan-si (KR)

(72) Inventors: Bum Mo Ahn, Suwon-si (KR); Seung Ho Park, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/931,432

(22) Filed: Nov. 3, 2015

(65) Prior Publication Data

US 2016/0126414 A1 May 5, 2016

(30) Foreign Application Priority Data

Nov. 3, 2014 (KR) .................. 10-2014-0151258

(51) Int. Cl.
*H01L 33/00* (2010.01)
*H01L 33/64* (2010.01)
(Continued)

(52) U.S. Cl.
CPC .......... *H01L 33/644* (2013.01); *H01L 33/486* (2013.01); *H05K 1/00* (2013.01);
(Continued)

(58) Field of Classification Search
CPC ......... H01L 2924/0002; H01L 2924/00; H01L 2224/16225; H01L 25/0753; H01L 33/486;
(Continued)

(56) References Cited

U.S. PATENT DOCUMENTS 7,425,083 B2 * 9/2008 Kim .................. H01L 33/62
257/98
7,906,794 B2 * 3/2011 Harrah ............... H01L 33/56
257/100
(Continued)

FOREIGN PATENT DOCUMENTS

KR 10-2007-0034251 3/2007
KR 10-2007-0034251 A 3/2007
(Continued)

OTHER PUBLICATIONS

Korean Patent Office, Office Action dated Sep. 21, 2015, pertaining to Korean Application No. 10-2014-0151258, 6 pages.
(Continued)

*Primary Examiner* — Teresa M Arroyo
(74) *Attorney, Agent, or Firm* — Sunstein Kann Murphy & Timbers LLP

(57) ABSTRACT

A chip substrate includes conductive portions, insulation portions, cavities and a heat dissipating portion. The insulation portions are alternately bonded to the conductive portions to electrically isolate the conductive portions. The lens insertion portions are formed on an upper surface of the chip substrate at a predetermined depth so as to extend across each of the insulation portions. Each of the lens insertion portions includes a predetermined number of straight sides and a predetermined number of arc-shaped corners formed in regions where the straight sides meet with each other. The cavities are formed inward of the lens insertion portions at a predetermined depth so as to extend across each of the insulation portions. The heat dissipating portion is bonded to a lower surface of the chip substrate.

10 Claims, 3 Drawing Sheets

(51) Int. Cl.
*H05K 1/00* (2006.01)
*H01L 33/58* (2010.01)
*H01L 33/48* (2010.01)
*H01L 25/075* (2006.01)

(52) U.S. Cl.
CPC ........ *H01L 25/0753* (2013.01); *H01L 33/483* (2013.01); *H01L 33/58* (2013.01); *H01L 2224/16225* (2013.01); *H01L 2924/0002* (2013.01)

(58) Field of Classification Search
CPC ..... H01L 33/644; H01L 33/483; H01L 33/58; H05K 1/00
USPC .......................................................... 257/98
See application file for complete search history.

(56) References Cited

U.S. PATENT DOCUMENTS

| | | | | |
|---|---|---|---|---|
| 2003/0189829 A1* | 10/2003 | Shimizu | F21L 4/00 | 362/240 |
| 2007/0131954 A1* | 6/2007 | Murayama | H01L 25/0753 | 257/98 |
| 2007/0145383 A1* | 6/2007 | Rho | H01L 25/0753 | 257/79 |
| 2007/0235743 A1* | 10/2007 | Lee | H01L 33/483 | 257/81 |
| 2009/0027884 A1* | 1/2009 | Chou | H01L 33/486 | 362/240 |
| 2010/0051982 A1* | 3/2010 | Lin | H01L 33/486 | 257/98 |
| 2010/0213484 A1* | 8/2010 | Lin | H01L 33/486 | 257/98 |
| 2010/0295070 A1* | 11/2010 | Su | H01L 25/0753 | 257/91 |
| 2011/0062454 A1* | 3/2011 | Wan | H01L 33/56 | 257/88 |
| 2013/0126913 A1* | 5/2013 | Hwu | H01L 25/0753 | 257/88 |
| 2014/0327024 A1* | 11/2014 | Ishihara | H01L 24/97 | 257/98 |
| 2016/0197245 A1* | 7/2016 | Park | H01L 33/486 | 362/373 |

FOREIGN PATENT DOCUMENTS

| | | |
|---|---|---|
| KR | 10-2007-0034251 A | 10/2008 |
| KR | 1020090075354 A | 7/2009 |
| KR | 10-0986211 | 10/2010 |
| KR | 10-1123241 | 6/2011 |
| KR | 2011-0066345 A | 6/2011 |
| KR | 20110066345 A | 6/2011 |
| KR | 1020130103198 | 9/2013 |

OTHER PUBLICATIONS

Darae Law & IP Firm, Office Action dated Sep. 21, 2015, pertaining to Korean Application No. 10-2014-0151258, 4 pages. (English Translation).

* cited by examiner

CHIP SUBSTRATE AND CHIP PACKAGE MODULE

CROSS-REFERENCE TO RELATED PATENT APPLICATION

This U.S. non-provisional patent application claims priority under 35 U.S.C. §119 of Korean Patent Application No. 10-2014-0151258 filed on Nov. 3, 2014 in the Korean Patent Office, the entire contents of which are hereby incorporated by reference.

BACKGROUND

1. Technical Field

The present invention relates to a chip substrate and a chip package module using the chip substrate.

2. Description of Related Art

In the related art, a space for mounting a chip to a chip substrate is formed on the upper surface of the chip substrate by mechanical processing or chemical etching. That is to say, Korean Patent No. 10-0986211 discloses a method in which mounting spaces are formed by etching an upper portion of an unprocessed rectangular metal plate.

In the case where an optical element chip such as a UV LED or the like is mounted on such a chip substrate, a space having a wide-top and narrow-bottom shape (i.e., a shape where a cross-sectional area thereof becomes smaller as a depth thereof grows larger) is formed in the chip substrate in order to enhance the light reflection performance. After forming the space, a chip is mounted within the space. The space is sealed by a lens in order to enhance the light efficiency.

Since the space for mounting a chip is formed in a circular shape when the chip substrate is viewed from above, the lens is also formed in a circular shape so as to correspond to the shape of the space.

However, it is more difficult to accurately process a lens into a circular shape than to process a lens into a shape having a straight line, such as a rectangular shape or a triangular shape.

SUMMARY

In view of the above problem of the related art, it is an object of the present invention to provide a chip substrate in which lens insertion spaces are formed in a shape having straight sides.

More specifically, it is an object of the present invention to provide a chip substrate in which chip mounting spaces and lens insertion spaces are separated from each other, the lens insertion spaces formed in a shape having straight sides and the chip mounting spaces formed inward of the lens insertion spaces.

In accordance with one aspect of the present invention, there is provided a chip substrate including conductive portions formed at the chip substrate; insulation portions alternately bonded to the conductive portions to electrically isolate the conductive portions; lens insertion portions formed at an upper surface of the chip substrate, each of the lens insertion portions including a groove having a predetermined depth over the insulation portion and including a predetermined number of straight sides and arc-shaped corners formed in regions where the straight sides meet with each other; cavities formed inward of the lens insertion portions having a predetermined depth over the insulation portions; and a heat dissipating portion bonded to a lower surface of the chip substrate.

In the chip substrate, each of the arc-shaped corners of the lens insertion portions may protrude outward from the straight sides.

In the chip substrate, each of the cavities may be formed in a wide-top and narrow-bottom shape so that a cross-sectional area thereof becomes smaller as a depth thereof grows larger, each of the cavities defined by an outer surface having a predetermined curvature.

The chip substrate may further include: metal layers formed on bottom surfaces of the cavities.

In the chip substrate, the heat dissipating portion may include: a heat dissipating interface portion bonded to the insulation portions and the conductive portions on the lower surface of the chip substrate; and a heat radiating portion bonded to the heat dissipating interface portion and configured to radiate heat generated from chips.

The chip substrate may further include: electrode connection portions formed on the upper surface of the chip substrate to apply voltages to the conductive portions.

The chip substrate may further include: electrode indicating portions disposed around the electrode connection portions to indicate polarities of the voltages applied to the conductive portions.

The chip substrate may further include: a side groove formed on at least one side surface of the chip substrate so that a space is formed between the chip substrate and another chip substrate.

In the chip substrate, an insulating material is filled in the side groove when the chip substrate is bonded to another chip substrate.

The chip substrate may further include: bolting portions formed on at least one surface of the chip substrate to fix a printed circuit board to the chip substrate.

In accordance with another aspect of the present invention, there is provided a chip package module, including: a chip substrate including: conductive portions formed at the chip substrate; insulation portions alternately bonded to the conductive portions to electrically isolate the conductive portions; lens insertion portions formed at an upper surface of the chip substrate, each of the lens insertion portions including a groove having a predetermined depth over the insulation portion and including a predetermined number of straight sides and arc-shaped corners formed in regions where the straight sides meet with each other; and cavities formed inward of the lens insertion portions having a predetermined depth over the insulation portions; and optical element chips mounted within the cavities; lenses inserted into the lens insertion portions to seal the cavities; and a heat dissipating portion bonded to a lower surface of the chip substrate.

According to the present invention, the lens insertion portions are formed in a shape having straight sides. This makes it possible to form lenses into a shape having straight sides. It is therefore possible to simplify the manufacturing process of the lenses which are inserted into the lens insertion portions.

DETAILED DESCRIPTION OF THE EMBODIMENTS

The following disclosure merely illustrates the principle of the invention. While not explicitly described or illustrated in the subject specification, it may be possible to invent different devices which realize the principle of the invention and which fall within the conception and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, a chip substrate will be described in detail with reference to the accompanying drawings. For the sake of convenience, descriptions will be made by taking an LED as an example of a chip.

In the present embodiment, in order to manufacture a chip substrate, a plurality of conductive portions having a predetermined thickness and made of an electrically conductive material and a plurality of insulation portions made of an insulating material are bonded to each other and alternately laminated with the insulation portion interposed between the conductive portions.

By heating and pressing the conductive portions and the insulation portions in laminated state, it is possible to manufacture a conductive material lump within which the insulation portions are disposed in a spaced-apart relationship. The manufacture of a chip substrate including the conductive portions and the insulation portions is completed by vertically cutting the conductive material lump. In the present embodiment, one direction is a vertical direction. The chip substrate is manufactured by vertically cutting the conductive material lump along a lamination direction and a direction orthogonal to the lamination direction.

A chip substrate according to the present embodiment is manufactured by forming a lens insertion portion and a cavity on the chip substrate manufactured by the aforementioned method.

Figure 1:
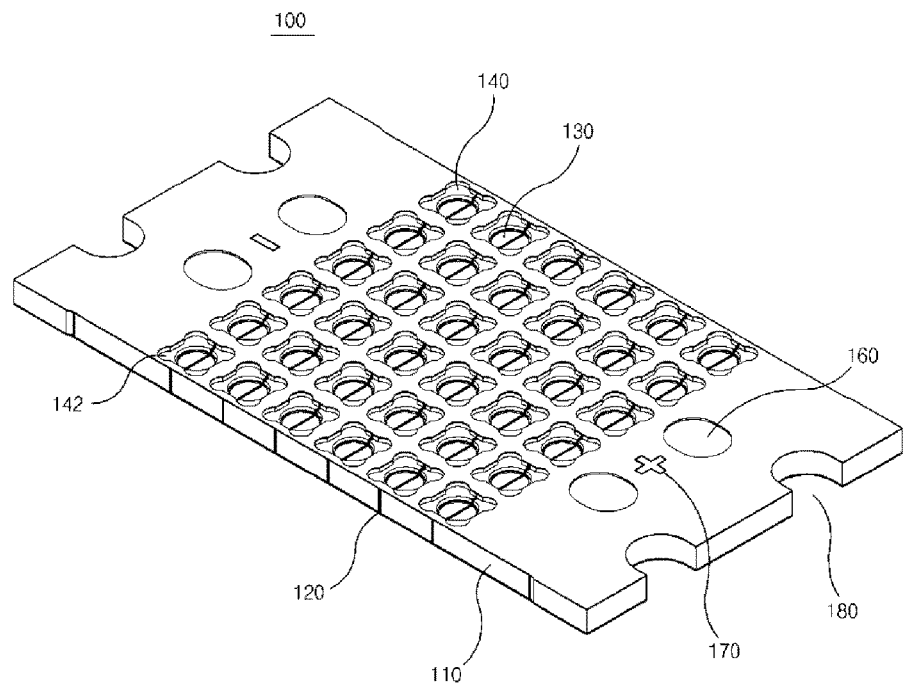
FIG. 1 is a perspective view illustrating a chip substrate according to one embodiment of the present invention.

The chip substrate according to the present embodiment has the form illustrated in FIG. 1. A plurality of lens insertion portions, a plurality of cavities and a plurality of electrode connection portions may be formed on the upper surface of the chip substrate.

The chip substrate according to the present embodiment will now be described with reference to FIGS. 1 and 2.

FIG. 1 is a perspective view illustrating a chip substrate 100 according to one embodiment of the present invention. Referring to FIG. 1, the chip substrate 100 according to the present embodiment includes conductive portions 110, insulation portions 120, lens insertion portions 140 and cavities 130. The lens insertion portions 140 are formed on the upper surface of the chip substrate 100. The cavities 130 are formed inward of the lens insertion portions 140. Each of the lens insertion portions 140 and each of the cavities 130 are formed so as to extend across each of the insulation portions 120.

In the present embodiment, the conductive portions 110 are bonded in one direction to constitute the chip substrate 100. The conductive portions 110 serve as electrodes for applying a voltage to the chips mounted in a subsequent process. The term "one direction" used herein refers to the direction in which the conductive portions 110 and the insulation portions 120 are alternately disposed and bonded to each other in the bonding step. In FIG. 1, one direction is the horizontal direction.

The insulation portions 120 are bonded to the conductive portions 110 to electrically isolate the conductive portions 110. That is to say, the conductive portions 110 insulated by the insulation portions 120 interposed between the conductive portions 110 may serve as positive electrode terminals and negative electrode terminals.

In the present embodiment, there is described an example in which one insulation portion 120 exists between two conductive portions 110. Alternatively, the chip substrate 100 may be configured by alternately laminating three or more conductive portions and two or more insulation portion. A larger number of insulation portions may be formed depending on the use of the chip substrate 100.

In the chip substrate 100 according to the present embodiment, the cavity 130 may be formed in a region which includes the insulation portion 120.

Each of the lens insertion portions 140 is formed on the upper surface of the chip substrate 100 so as to extend across each of the insulation portions 120 is composed of a groove having a predetermined depth. Each of the lens insertion portions 140 has a predetermined number of sides and a predetermined number of arcs formed between the sides.

Referring to FIG. 1, on the upper surface of the chip substrate 100 including the conductive portions 110 and the insulation portions 120, each of the lens insertion portions 140 is formed in a region including one insulation portion 120. In the present embodiment, each of the lens insertion portions 140 has four straight sides and four arc-shaped corners where the respective sides meet with each other. That is to say, each of the lens insertion portions 140 is formed of a groove having four straight sides parallel to the respective sides of the chip substrate 100 illustrated in FIG. 1.

It is preferred that the corners of each of the lens insertion portions 140 are formed into arcs. In the case where a rotary cutting machine such as a milling machine or the like is used in cutting the chip substrate 100 to form the lens insertion portions 140, it is difficult to form a groove having right-angle corners. However, if each of the lens insertion portions 140 has arc-shaped corners, a cutter can easily form a groove by initially forming a straight side through linear movement and then forming an arc-shaped corner.

In the present embodiment, as illustrated in FIG. 1, the arc-shaped corners of each of the lens insertion portions 140 are preferably formed to protrude outward from the extension lines of the straight sides. Each of the lens insertion portions 140 is configured to accommodate a lens and is formed in a substantially rectangular shape in order to solve a difficulty involved in the manufacturing process of a conventional circular lens. In the present embodiment, it is preferred that the arc-shaped corners of each of the lens insertion portions 140 protrude outward so as to accommodate the right-angle corners of a rectangular lens.

Referring to FIG. 1, each of the lens insertion portions 140 of the chip substrate 100 according to the present embodiment includes four straight sides and four arc-shaped corners 142 protruding outward. By forming the arc-shaped corners 142 protruding outward from the straight sides, it is possible to form jig grooves on the chip substrate 100. When a rectangular lens is moved and fixed using a jig or a robot instead of a sucking method, the jig grooves assist in smoothly and accurately performing a bonding process.

In a hypothetical case where the arc-shaped corners of each of the lens insertion portions 140 are formed to protrude inward from the extension lines of the straight sides, it is necessary to process the corners of the lens in conformity with the curvature of the arc-shaped corners. In contrast, if the arc-shaped corners each of the lens insertion portions 140 are formed to protrude outward as in the present embodiment, it is possible for each of the lens insertion portions 140 to easily accommodate a lens having right-angle corners. The lens may be fixed at the respective straight sides. The air gaps left between the arc-shaped corners of each of the lens insertion portions 140 and the right-angle corners of the lens may be encapsulated in a subsequent process. Thus, the insertion of the lens is completed.

In the present embodiment, there is described an example in which each of the lens insertion portions 140 has four straight sides so as to accommodate a rectangular lens. The number of the arc-shaped corners may vary depending on the shape of the lens. The arc-shaped corners may be formed in some of the corners where the straight sides meet with each other. In other corners, the straight sides may be directly connected to each other.

The chip substrate 100 according to the present embodiment may further include cavities 130 formed inward of the aforementioned lens insertion portions 140 in the regions including the insulation portions 120.

Figure 2:
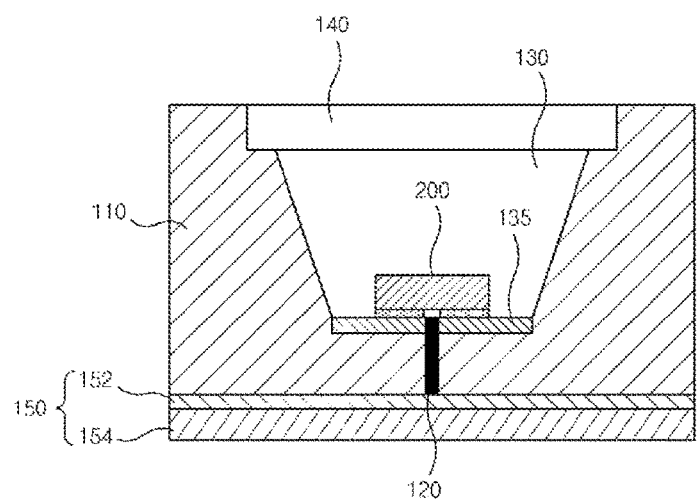
FIG. 2 is a sectional view of the chip substrate according to one embodiment of the present invention.

Referring to FIG. 2, each of the lens insertion portions 140 is formed at a predetermined depth on the surface of the chip substrate 100 and each of the cavities 130 is formed deeper than each of the lens insertion portions 140.

In the present embodiment, each of the cavities 130 is preferably formed in a wide-top and narrow-bottom shape so that the width of each of the cavities 130 becomes narrow toward the bottom. Each of the cavities 130 is formed in a wide-top and narrow-bottom shape in order to enhance the light reflection performance of the chip mounted within each of the cavities 130. As can be noted in the cross section illustrated in FIG. 2, each of the cavities 130 is defined by a slant outer wall.

The outer wall of each of the cavities 130 may be formed in a curved shape. In this case, it is preferred that each of the cavities 130 has a hemispherical shape. Each of the cavities 130 is capable of enhance the light reflection performance of the mounted chip and is capable of increasing the brightness by focusing the light on one point. For that reason, each of the cavities 130 is defined by the outer wall having a predetermined curvature.

Furthermore, each of the cavities 130 includes a central portion preferably formed into a circular flat surface. That is to say, the cavity 130 may include a flat surface so that a chip can be mounted within each of the cavities 130 without being inclined with respect to the chip substrate 100.

The chip substrate 100 according to the present embodiment may further include a metal layer 135 formed on the flat bottom surface of each of the cavities 130. The metal layer 135 is made of metal such as copper or the like. A chip 200, e.g., a flip chip, having electrode portions on the lower surface thereof is directly mounted on the metal layer 135 which is bisected by the insulation portion 120.

The chip substrate 100 according to the present embodiment may further include a heat dissipating portion 150 bonded to the lower surface of the chip substrate 100.

That is to say, the heat dissipating portion 150 may be bonded to the lower surface of the chip substrate 100 in order to dissipate the heat generated from the chip 200 mounted within each of the cavities 130.

The heat dissipating portion 150 may include a heat dissipating interface portion 152 bonded to one insulation portion 120 and two conductive portions 110 on the lower surface of the chip substrate 100, and a heat radiating portion 154 bonded to the heat dissipating interface portion 152 so as to radiate the heat generated from the chip 200.

The heat dissipating interface portion 152 may be configured by an insulator so as to have an insulating ability and a heat dissipating ability. The heat radiating portion 154 disposed under the heat dissipating interface portion 152 may be formed of a metal sheet such as a copper sheet or an aluminum sheet. In view of the heat dissipating characteristics, it is preferred that the heat dissipating interface portion 152 has a reduced thickness.

The chip substrate 100 according to the present embodiment may further include electrode connection portions 160 formed on the upper surface of the chip substrate 100 so as to apply a voltage to the conductive portions 110. That is to say, an electrode connection portion 160 for applying a positive voltage and an electrode connection portion 160 for applying a negative voltage may be formed on the upper surface of the chip substrate 100. Electrode indicating portions 170 may be disposed around the electrode connection portions 160 so that a user can easily recognize the polarities of the electrode connection portions 160.

Figure 3A:
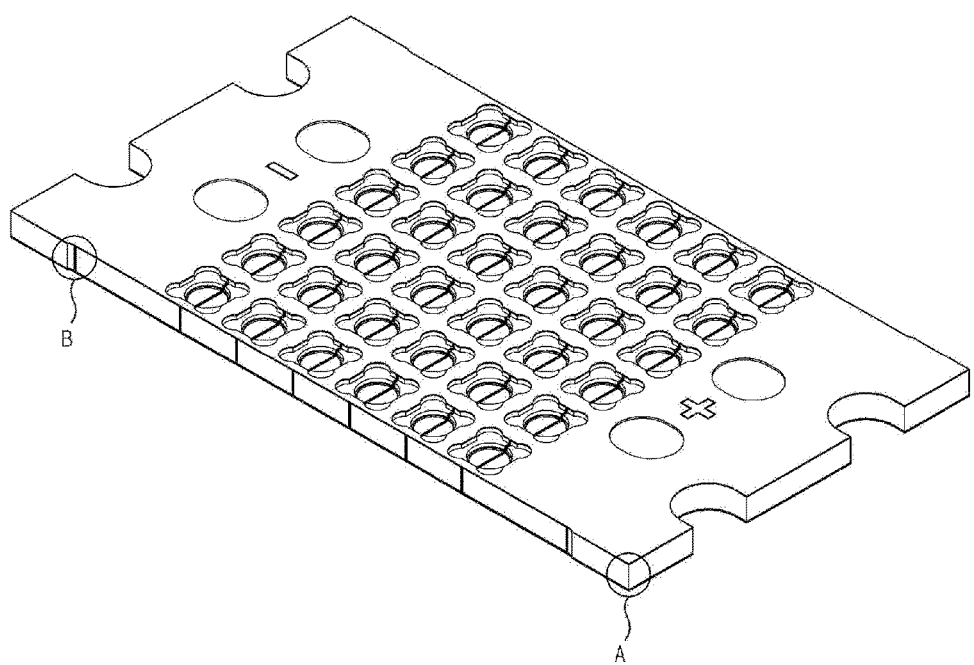
FIG. 3A is a perspective view of the chip substrate according to one embodiment of the present invention.
Figure 3B:
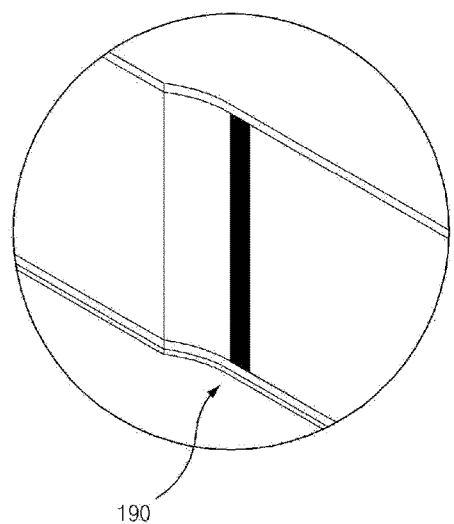
FIGS. 3B and 3C are enlarged views of the chip substrate illustrated in FIG. 3A.
Figure 3C:
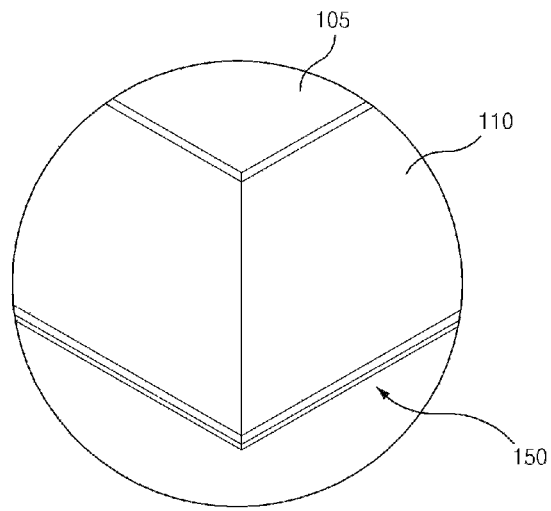

Referring to FIGS. 3A to 3C, the chip substrate 100 according to the present embodiment may further include a side groove 190 and bolting portions 180.

Figure 4:
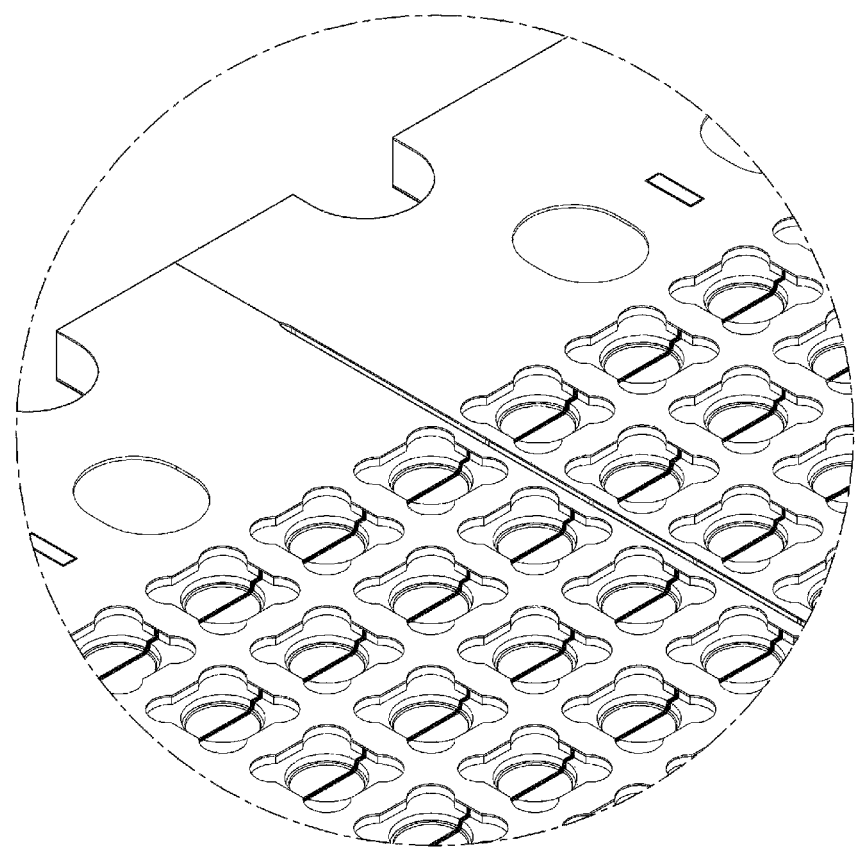
FIG. 4 is a view illustrating a bonding example of the chip substrate according to one embodiment of the present invention.

Referring to FIG. 4, a plurality of chip substrates 100 according to the present embodiment may be connected to each other and may be used as an array. That is to say, the chip substrates 100 may be bonded to each other at the side surfaces thereof, thereby providing an array which has a desired illumination area. In this case, for the purpose of preventing occurrence of short circuit between the respective chip substrates 100, the side groove 190 illustrated in FIG. 3B is formed on the side surface of each of the chip substrates 100 so that the conductive portions 110 of the respective chip substrates 100 do not make contact with each other.

In this case, an insulating material may be filled in the space formed between the side groove 190 of one chip substrate and the side surface of the other chip substrate. That is to say, the insulating material filled in the side groove 190 which is formed to prevent occurrence of short circuit. For this purpose, the side groove 190 is formed even on the heat radiating portion 154 by mechanical processing in a substrate manufacturing process. Then, the insulating material may be filled in the side groove 190.

In the present embodiment, the insulating material may be an epoxy-based resin, e.g., polyimide. The insulating material may be the same material as the insulator bonded to the heat radiating portion 154.

Referring again to FIG. 3A, the chip substrate 100 according to the present embodiment may further include bolting portions 180 for fixing a printed circuit board to the chip substrate 100.

Referring to FIG. 3C, a white solder resist 105 may be coated on the upper surface of the chip substrate 100 according to the present embodiment. The white solder resist 105 is coated in order to prevent occurrence of short circuit between the conductive portions 110 and to enhance the light reflection performance.

A chip package module may be manufactured by mounting optical element chips 200 within the cavities 130 of the chip substrate 100 according to the present embodiment and inserting lenses into the lens insertion portions 140.

The chip substrate 100 described above is conceived to remove a manufacturing process difficulty in that a lens needs to be formed in a circular shape in conformity with the circular shape of a conventional chip mounting space. In the present embodiment, prior to forming the circular cavities in which lenses are mounted, the lens insertion portions 140 are formed to have straight sides. This makes it possible to form the lenses in a shape including straight lines. It is therefore possible to simplify the substrate manufacturing process.

Furthermore, the arc-shaped corners are formed in the regions where the straight sides meet with each other. This enables a cutter to easily move from one straight side to the other when forming the lens insertion portions 140. Jig grooves may be formed in the straight sides. This makes it possible to easily perform a lens bonding process.

The forgoing descriptions are mere illustration of the technical idea of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

What is claimed is:

1. A chip substrate, comprising:
   conductive portions;
   insulation portions to electrically isolate the conductive portions from one another;
   lens insertion grooves formed at an upper surface, each of the lens insertion grooves having a first predetermined depth, an outer periphery of each of the lens insertion grooves being generally shaped as a polygon with a plurality of straight sides whose corners are arc-shaped;
   cavities further depressed from the lens insertion grooves with a second predetermined depth, each of the cavities having a bottom surface wherein one of the insulation portions is exposed at the bottom surface of each of the cavities; and
   a heat dissipating portion bonded to a lower.

2. The chip substrate of claim 1, wherein a contour of each of the arc-shaped corners of the lens insertion grooves protrudes outward from the straight sides.

3. The chip substrate of claim 1, wherein each of the cavities is formed in a wide-top and narrow-bottom shape so that a cross-sectional area thereof becomes smaller as a depth thereof grows larger, each of the cavities defined by an outer surface having a predetermined curvature.

4. The chip substrate of claim 1, further comprising:
   metal layers formed on bottom surfaces of the cavities.

5. The chip substrate of claim 1, wherein the heat dissipating portion includes:
   a heat dissipating interface portion bonded to the insulation portions and the conductive portions on the lower surface; and
   a heat radiating portion bonded to the heat dissipating interface portion and to radiate heat transferred thereto.

6. The chip substrate of claim 1, further comprising:
   electrode connection portions formed on the upper surface to apply voltages to the conductive portions.

7. The chip substrate of claim 6, further comprising:
   electrode indicating portions disposed around the electrode connection portions to indicate polarities of the voltages applied to the conductive portions.

8. The chip substrate of claim 1, further comprising:
   a side groove formed on at least one side surface so that a space is formed.

9. The chip substrate of claim 1, further comprising:
   bolting portions formed on at least one surface to fix a printed circuit board thereto.

10. A chip package module, comprising:
    a chip substrate comprising:
       conductive portions;
       insulation portions to electrically isolate the conductive portions;
       lens insertion grooves formed at an upper surface, each of the lens insertion portions including a groove having a predetermined depth, an outer periphery of each of the lens insertion grooves being generally shaped as a polygon with a plurality of straight sides whose corners are arc-shaped;
       cavities further depressed from the lens insertion grooves with a second predetermined depth, each of the cavities having a bottom surface wherein one of the insulation portions is exposed at the bottom surface of each of the cavities;
    optical element chips mounted within the cavities; and
    lenses inserted into the lens insertion grooves to seal the cavities; and
    a heat dissipating portion bonded to a lower surface.

* * * * *